United States Patent
Comulada, Jr. et al.

(10) Patent No.: US 6,504,388 B2
(45) Date of Patent: *Jan. 7, 2003

(54) ELECTRICAL TEST TOOL HAVING EASILY REPLACEABLE ELECTRICAL PROBE

(75) Inventors: Ralph Richard Comulada, Jr., Rock Tavern, NY (US); Michael Philip Goldowsky, Valhalla, NY (US); John P. Karidis, Ossining, NY (US); Gerard McVicker, Wappingers Falls, NY (US); Yuet-Ying Yu, Hopewell Junction, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/464,925

(22) Filed: Dec. 16, 1999

(65) Prior Publication Data

US 2002/0014892 A1 Feb. 7, 2002

Related U.S. Application Data

(62) Division of application No. 09/003,486, filed on Jan. 6, 1998, now Pat. No. 6,127,832.

(51) Int. Cl.[7] .............................................. G01R 31/02
(52) U.S. Cl. ..................................... 324/754; 324/762
(58) Field of Search ................................ 324/754, 755, 324/761, 762

(56) References Cited

U.S. PATENT DOCUMENTS

| 3,571,708 A | * | 3/1971 | Hurt ............................ 324/133 |
| 3,648,169 A | | 3/1972 | Wiesler |
| 3,812,311 A | | 5/1974 | Kvaternik |
| 3,819,282 A | * | 6/1974 | Schultz ........................ 401/105 |
| 3,829,776 A | * | 8/1974 | Lozoya ........................ 324/122 |
| 4,056,777 A | | 11/1977 | Roch |
| 4,382,228 A | | 5/1983 | Evans |
| 5,006,793 A | | 4/1991 | Gleason et al. |
| 5,015,947 A | | 5/1991 | Chism |
| 5,153,472 A | | 10/1992 | Karidis et al. |
| 5,180,955 A | | 1/1993 | Karidis et al. |
| 5,334,931 A | | 8/1994 | Clarke et al. |
| 5,417,595 A | * | 5/1995 | Cullen et al. ............... 439/700 |
| 5,453,702 A | | 9/1995 | Creeden |
| 5,457,882 A | | 10/1995 | Clarke et al. |
| 5,511,304 A | | 4/1996 | Aksu |

* cited by examiner

Primary Examiner—Michael Sherry
Assistant Examiner—Russell M. Kobert
(74) Attorney, Agent, or Firm—Steven Capella

(57) ABSTRACT

Disclosed is an improved probe housing mechanism that will allow for the quick release of a probe tip from a testing tool. The invention includes a probe housing, a double cantilevered beam for holding a probe tip, and a releasable spring mechanism for holding the beam into place. The spring mechanism can be released by squeezing the spring together or by releasing a non-removable locking screw, thereby allowing the beam to be slidably removed from the probe housing for easy replacement.

2 Claims, 3 Drawing Sheets ially automated devices have been developed. Such patented devices include

ELECTRICAL TEST TOOL HAVING EASILY REPLACEABLE ELECTRICAL PROBE

This application is a divisional of Ser. No. 09/003,486 filed on Jan. 6, 1998, now U.S. Pat. No. 6,127,832.

BACKGROUND OF THE INVENTION

1. Field of the Invention

The present invention relates to point of contact test tools for testing integrated circuit chips, and more particularly to a test tool that includes an easily replaceable probe tip.

2. Related Art

As integrated circuit (IC) devices become smaller and more densely populated, performing electrical point of contact testing becomes increasingly more difficult. As the number of circuits on a device increases, the number of required tests also increases. Thus, there is an ongoing need to develop test equipment that can operate at higher and higher rates of speed. Moreover, as the circuits become smaller and smaller, the precision required by the test equipment likewise increases. In order to achieve high speed precision in point of contact testing, specialized automated devices have been developed. Such patented devices include IBM's Hummingbird Mini-positioner (U.S. Pat. No. 5,180,955) and IBM's Probe positioning Actuator (U.S. Pat. No. 5,153,472).

The Hummingbird Mini-positioner uses single or double cantilever beam probes to perform electrical tests. These probes are screwed in place onto an actuator which moves up and down along the z-axis to contact a point beneath the probe. The actuator is also positionable along the x and y axises in order to contact various points on the device being tested. Test equipment, such as the Hummingbird Mini-positioner can perform over 100 tests per second with an accuracy in the range of five microns.

Unfortunately, due the demand placed on such test equipment, the delicate probes wear out often and must be changed regularly. Because the probe tips are so small, typically less than 2.5 millimeters, and the screw that holds the probe assembly in place is even smaller, typically 0.5 millimeters, it is extremely tedious and time consuming to change the very tiny screw that holds the assembly in place. The probes and screws are so small that when dropped they are virtually lost. More importantly, the screws can be sucked into the test equipment body by any magnets that reside within the equipment, causing expensive mechanical damage.

Therefore, without a better way of changing probe tips in precision point of contact test equipment, the time and costs involved in testing IC devices will be increased. All of the aforementioned prior art is hereby included by reference.

SUMMARY OF THE INVENTION

The present invention provides an improved probe housing that eliminates existing screw mounted systems. The invention allows a cantilever beam assembly to be slid into a dovetail housing and locked into place. Locking is accomplished using a quick release system that provides a releasable force onto the cantilever beam. The force is provided with a cantilever spring in a first embodiment and with a non-removable cam device (e.g., a non-removable screw system) in a second embodiment.

The improvement simplifies the changing of probe tips and reduces the possibility of tiny screws being sucked into the body of the test equipment. Moreover, the invention lends itself to the automated changing of probe tips, which would be highly desirable in a high production environment where high wear of probe tips is experienced.

BEST MODE FOR CARRYING OUT THE INVENTION

Figure 1:
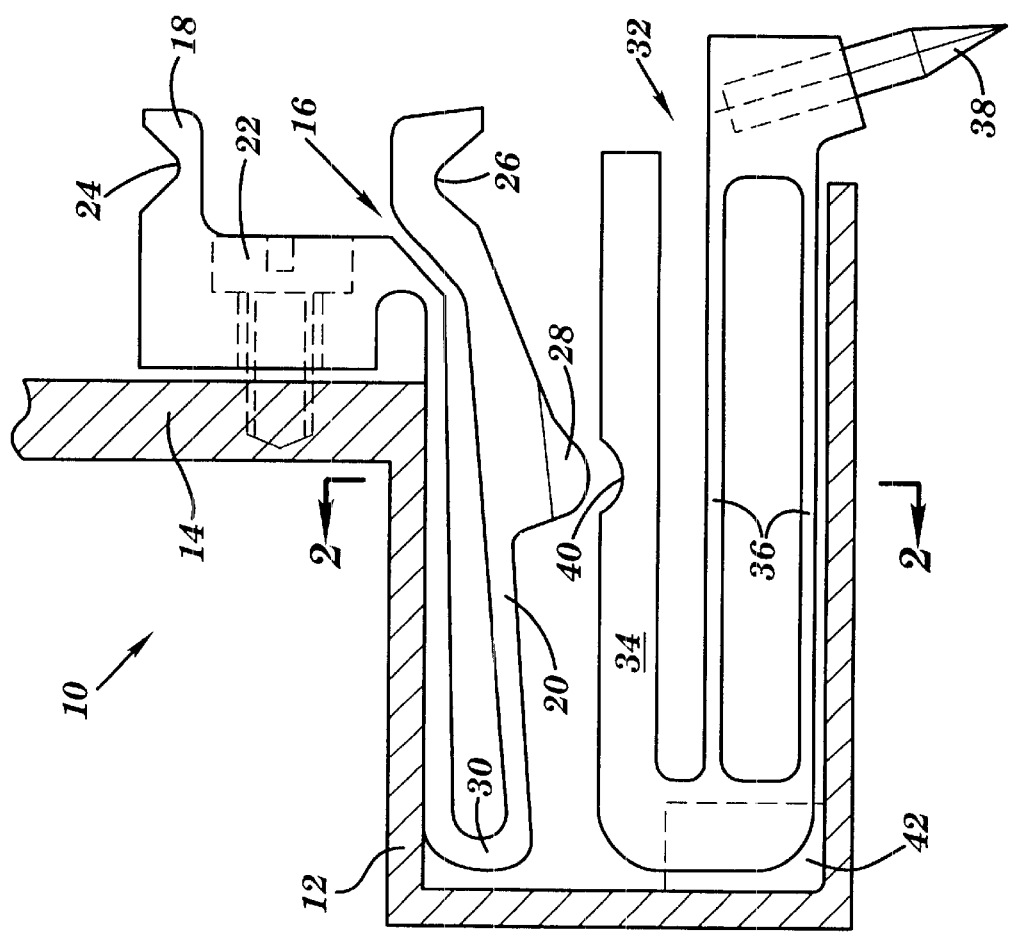
FIG. 1 is a side view cross-section of a probe assembly with a hold down spring and a double cantilever beam probe in accordance with a first preferred embodiment of the present invention.

FIG. 1 depicts a longitudinal cross-section through a probe housing assembly 10 comprising a housing 12 and a vertical support member 14. Residing within the housing 12 is a quick release mechanism 16 and a probe assembly comprising a double cantilever beam 32 which holds probe tip 38. Although a double cantilever beam is shown as the preferred embodiment, a single cantilever beam probe can also be accommodated. The double cantilever beam 32 includes a lower beam 36 for holding probe tip 38 and an upper dovetail beam 34. The dovetail beam 34 is shaped such that the double cantilever beam 32 can be slid into a matching dovetail in the housing 44 (see FIG. 2).

Figure 2:
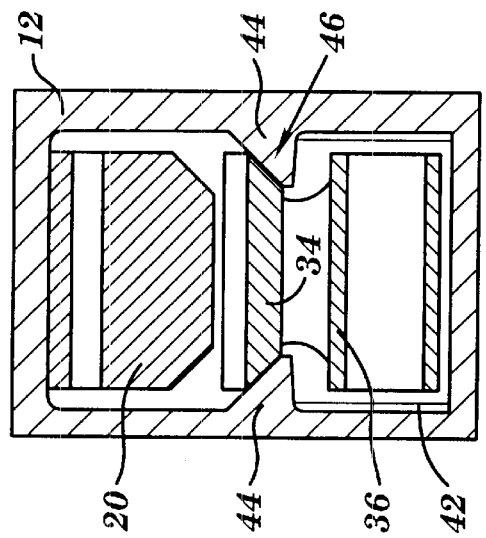
FIG. 2 depicts a front cross-section of the probe housing of FIG. 1.

Quick release mechanism 16 includes an upper fixed portion 18, which is affixed to vertical support member 14 with a screw 22, and a lower movable portion 20 (shown in the retracted position). Once the quick release mechanism 16 is installed, it need not be removed. Quick release mechanism 16 further includes a C-shaped spring 30 that causes lower movable portion 20 to exert a downward force on the dovetail beam 34. The spring force is calibrated to greatly exceed the probing force placed on the probe tip 38 during testing. Since the quick release mechanism 16 only locks in place the upper dovetail beam 34, the lower beam 36 is free to flex up and down during probing. The lower beam sides have clearance with the housing as shown in FIG. 2.

A nib 28 on the quick release mechanism 16 is used as the contact point for the hold down force. The nib 28 engages a detent 40 in the dovetail beam 34. The nib 28 accurately positions and locks the dovetail beam 34 into place. In addition, the nib 28 acts as the electrical contact point for transmission of the tip signal up through the probe housing assembly 10.

Quick release mechanism 16 includes opposed notches 24 and 26 that can be squeezed to retract (i.e., raise) the lower movable portion 20. In FIG. 1, the quick release mechanism 16 is shown in its retracted position in order to accommodate the installation or removal of the double cantilever beam 32. Releasing the quick release mechanism 16 causes the spring 30 to extend downward and exert a downward force on the detent 40 thereby securing the beam 32 in place. Squeezing the opposed notches 24 and 26 can be done with tweezers or the like for manual replacement. Alternatively, an automated system could be adapted to facilitate probe replacement.

The spring material may be tempered beryllium copper with gold plating to ensure good electrical contact at the detent and to provide good continuity to the probe tip. However, since gold plating can wear out after many probe insertions, an alternate material, such as a nickel, beryllium, palladium alloy may be preferable. Such an alloy has inherently low contact resistance, is very strong, and requires no plating. The housing 10 may be made of any non-conducting material such as molded plastic. Exterior surfaces may be plated to provide electrical shielding. It is understood that the exact choice of materials are not critical to this invention.

To install a probe assembly, the nib 28 is lifted up by squeezing the two notches 24 and 26 together or toward one another. The probe's beam 32 is slid into the housing and the spring is then released. The beam 32 is pushed in until the nib 28 engages and locks into the detent 40 on the dovetail beam 34. To remove the probe assembly, lower movable portion 20 of the quick release mechanism 16 is lifted up using the provided notches 24 and 26. This lifts the nib 28 out of the detent 40 allowing the double cantilever beam 32 to be slid out. The lower movable portion 20 of the quick release mechanism 16 above the notch 26 may be designed to contact the upper portion 18 of the quick release mechanism 16 when fully retracted in order to limit spring deflection and stresses.

Referring to FIG. 2, a front view cross section of the probe housing 12 is depicted. It can be seen that a housing dovetail 44 extends inwardly from both side walls of the housing 12. The housing dovetail 44 mates with the dovetail beam 34 in order to provide stable placement of the double cantilever beam 32 within the housing. In addition, guides 42 are located on either side of the lower back portion of the housing 12 below the housing dovetail 44. These guides 42 keep the dovetail beam 34 from rotating on the housing dovetail 44 thereby maintaining square alignment of the double cantilever beam 32 during insertion.

Figure 3:
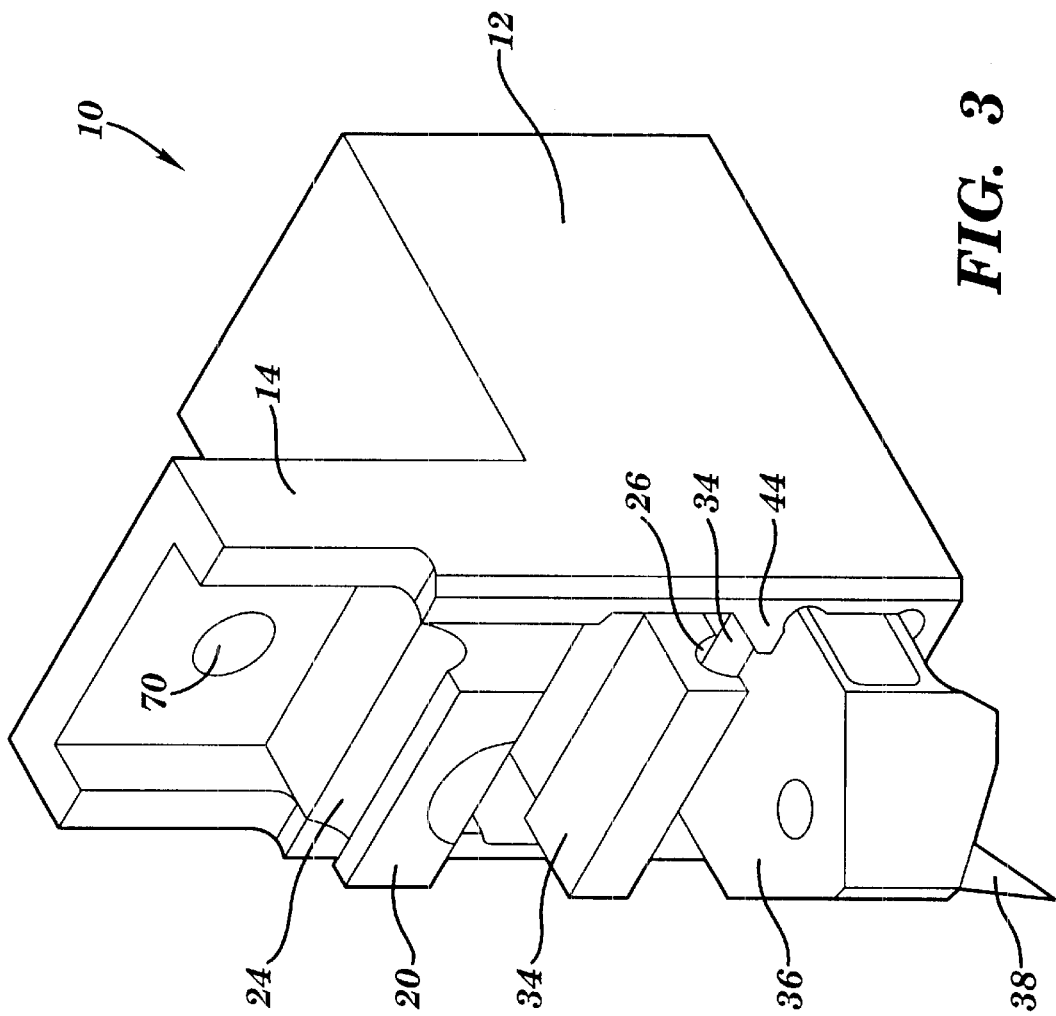
FIG. 3 depicts an isometric view of the probe assembly of FIG. 1.

FIG. 3 depicts an isometric drawing of the probe assembly 10. The assembly includes a screw hole 70 for mounting to a Z-axis actuator. It can be seen that the assembly 10 is small and compact, which not only minimizes impact forces when probing, but also ensures that the Z-axis actuator is not loaded down with high inertia.

In the embodiment described in FIGS. 1–3, it is recognized that a large enough side load placed on the probe tip 38 could cause the undesired rotation of the dovetail beam 34 within the probe housing 12. Because no sideways motion of the tip is desired, a much larger hold down force may be utilized to solve the problem.

Figure 4:
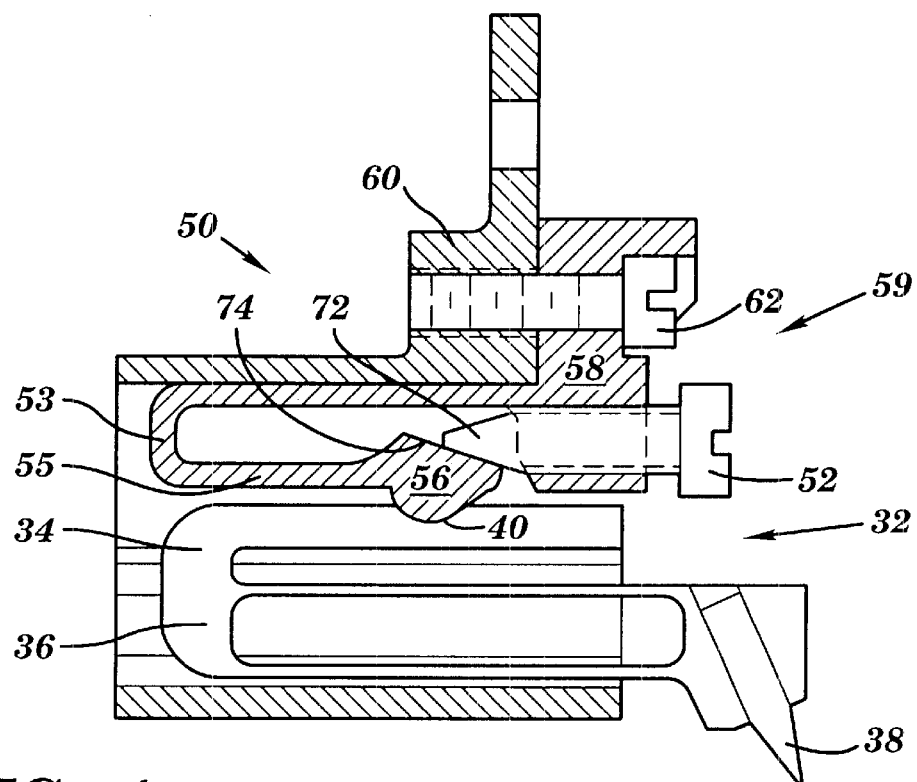
FIG. 4 depicts a side view cross-section of a probe assembly that includes a spring locking screw in accordance with a second preferred embodiment of the present invention.
Figure 5:
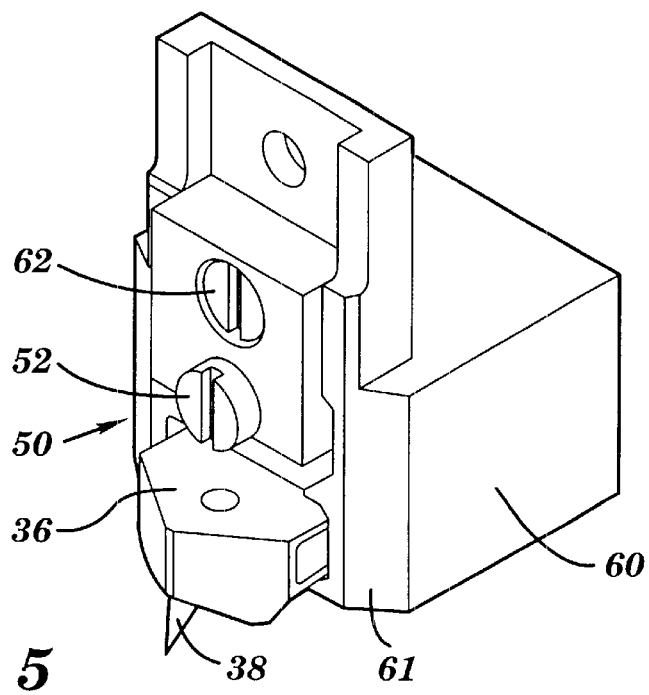
FIG. 5 depicts an isometric view of the probe assembly of FIG. 4.

An alternate configuration 50 which includes a higher hold down force is depicted in FIGS. 4 and 5. This embodiment utilizes a quick release mechanism 59 that includes a non-removable screw 52 to apply a large downward load via spring system 53. The tip 72 of the screw 52 is tapered and engages a matching taper 74 on the lower portion of the quick release mechanism 59. The spring may or may not be force biased down in this design. Rather, it is pushed down by the cam action of the screw tip 72. The force produced by the screw can be up to 5 lbs or more. This force keeps the dovetail beam 34 from moving in the housing even when the tip is experiencing large side loads.

Similar to the embodiment depicted in FIGS. 1–3, this embodiment utilizes a quick release mechanism 59 that includes an upper fixed portion 58 affixed to the housing 60 with a mounting screw 62 and a lower movable portion 55. The double cantilever beam 32 is essentially the same as that shown in FIGS. 1–3.

To remove the double cantilever beam 32, the screw 52 is backed out a few turns to provide clearance for the dovetail beam 34. As the beam 32 is slid out, the nib 56 of the quick release mechanism rises out of the detent 40 permitting the beam 32 to be withdrawn. When installing the beam 32, the rounded leading edge of the beam 32 pushes the lower movable portion 55 up allowing the nib 56 to fall in the detent 40. The spring 53 may therefore be designed to be very slightly force biased down.

The screw 52 is conveniently accessible from the front of the assembly 50. Being unnecessary to remove, it poses no particulate hazard, unlike the screw-in type probes. The probe housing 60 and dovetail must be capable of handling a somewhat higher (e.g., 5 lb.) screw load. Plastic housings must have adequate wall thickness to limit bulging out of the dovetail wall. A thick dovetail wall 61 is evident in FIG. 5.

The foregoing descriptions of the preferred embodiments of the invention have been presented for purposes of illustration and description only and are not intended to be exhaustive or to limit the invention to the precise form disclosed, and obviously many modifications and variations are possible in light of the above teachings. Such modifications and variations that may be apparent to a person skilled in the art are intended to be included with in the scope of this invention as defined in the accompanying claims.

We claim:

1. A high speed point of contact testing tool that includes an easily removable probe tip comprising:

a housing adapted for operational mounting to an automated test probe;

a release mechanism having a first portion affixed to the housing and a second portion capable of applying a downward pressure; and a double cantilever beam slidably received within the housing below the release mechanism, wherein the double cantilever beam includes an upper beam that receives the downward pressure from the second portion of the release mechanism, and a lower beam adapted to receive the probe tip.

2. A high speed point of contact testing tool that includes an easily removable probe tip comprising:

a housing adapted for operational mounting to an automated test probe;

a release mechanism including a first portion affixed to the housing, and a second portion having a nib capable of applying a downward pressure; and a double cantilever beam slidably received within the housing below the release mechanism, wherein the double cantilever beam includes an upper beam having a detent that receives the downward pressure from the nib of the second portion of the release mechanism, and a lower beam adapted to receive the probe tip.

* * * * *